United States Patent [19]

Geipel, Jr. et al.

[11] Patent Number: 4,462,151

[45] Date of Patent: Jul. 31, 1984

[54] METHOD OF MAKING HIGH DENSITY COMPLEMENTARY TRANSISTORS

[75] Inventors: Henry J. Geipel, Jr.; Ronald R. Troutman, both of Essex Junction; John M. Wursthorn, Underhill Center, all of Vt.

[73] Assignee: International Business Machines Corporation, Armonk, N.Y.

[21] Appl. No.: 446,793

[22] Filed: Dec. 3, 1982

[51] Int. Cl.³ .................. H01L 21/22; H01L 29/78; H01L 11/14

[52] U.S. Cl. .................. 29/576 B; 29/571; 148/1.5; 148/187; 357/42; 357/91

[58] Field of Search .................. 148/1.5, 187; 29/571, 29/576 B; 357/42, 91

[56] References Cited

U.S. PATENT DOCUMENTS

| | | | |
|---|---|---|---|
| 3,700,507 | 10/1972 | Murray | 148/187 |
| 3,920,481 | 11/1975 | Hu | 148/1.5 |
| 4,002,501 | 1/1977 | Tamura | 148/1.5 |
| 4,045,250 | 8/1977 | Dingwall | 148/1.5 |
| 4,110,899 | 9/1978 | Nagasawa et al. | 29/571 |
| 4,183,134 | 1/1980 | Oehler et al. | 148/187 |
| 4,268,321 | 5/1981 | Meguro | 148/1.5 |
| 4,385,947 | 5/1983 | Halfacre et al. | 148/187 |
| 4,391,650 | 7/1983 | Pfeifer et al. | 148/1.5 |
| 4,406,710 | 9/1983 | Davies et al. | 148/1.5 |
| 4,422,885 | 12/1983 | Brower et al. | 148/1.5 |
| 4,433,468 | 2/1984 | Kawamata | 29/571 |

Primary Examiner—Upendra Roy
Attorney, Agent, or Firm—Stephen J. Limanek

[57] ABSTRACT

A simple process is provided which forms a bulk CMOS structure by depositing a layer of material which resists oxidation, e.g., a barrier layer of silicon nitride on an N− semiconductor substrate, forming a P well in the substrate through a given segment of the barrier layer, removing a first segment of the barrier layer to form N+ regions for N channel source and drain and N− substrate contact, removing a second segment of the barrier layer to form a P+ field region, removing a third segment of the barrier layer to form P+ regions for source and drain of a P channel device, forming a first control electrode having a given work function for the P channel device which acts as an ion barrier and then forming a second control electrode between the N channel source and drain regions having a work function different from that of the first control electrode.

15 Claims, 6 Drawing Figures

METHOD OF MAKING HIGH DENSITY COMPLEMENTARY TRANSISTORS

DESCRIPTION

Technical Field

This invention relates to a method of making very dense integrated semiconductor structures and, more particularly, to a simple method of making a dense array of transistors in the complementary metal oxide semiconductor (CMOS) technology wherein both N and P channel transistors are formed on a common substrate.

Background Art

It is well known that in the CMOS technology the devices draw virtually no standby power but that bulk CMOS structures are inherently limited by (1) lateral/vertical bipolar parasitic devices leading to latch-up, (2) non-complementary thresholds for the N and P channel devices, (3) difficulty in forming an N well with total compatibility for the N channel device, (4) incorporating a guardring without serious area penalties, (5) tolerance on effective channel length and (6) severe topology.

Processes for providing CMOS devices are taught in, e.g., U.S. Pat. Nos. 4,002,501, filed June 16, 1975, and 4,183,134, filed Dec. 11, 1978. These patents teach processes for making complementary devices which have controlled channel lengths and low gate overlap capacitance by the use of thick insulators over their source and drain regions.

Other processes and structures known in the CMOS technology are taught in U.S. Pat. No. 4,045,250, filed Aug. 4, 1975, which discloses a process for producing a CMOS structure having a process step wherein a single oxidation step grows relatively thick isolation and source/drain passivation concurrently, and in U.S. Pat. No. 3,700,507, filed Oct. 21, 1969, which discloses a method for making CMOS structures with a reduced number of heat treatment steps.

In commonly assigned U.S. patent application having Ser. No. 352,990, filed on Feb. 26, 1982, by S. Dash et al, there is described a method of making complementary field effect transistors in a semiconductor layer formed on an insulator having a first portion which includes an N type transistor with a channel region defined by N+ source and drain regions and having a second portion including a P type transistor with a channel region defined by P+ source and drain regions. An insulating layer is disposed over the first and second portions with thin insulating films formed only over the channel regions. The method includes applying a photoresist layer over the insulating layer with an opening over one of the thin insulating films, introducing a first impurity into the channel region of the one portion to adjust the impurity therein, depositing a first conductive material on the thin insulating film located over the channel region of the one portion. The photoresist layer is then removed and a second impurity is introduced into the channel region of the other portion to adjust the impurity therein. A second conductive material is deposited on the thin insulating film located over the channel region of the other portion and in contact with the first conductive material, with the second conductive material having a different work function than that of the first conductive material. The first conductive material is, preferably, platinum silicide while the second conductive material may be aluminum.

DISCLOSURE OF THE INVENTION

It is an object of this invention to provide a process for making a very planar CMOS structure, particularly a bulk structure, to achieve high density and better overall control of parameters with minimal dopant diffusions for optimal device profile control.

In accordance with the teachings of this invention, a process is provided for making a planar CMOS structure having work function-adjusted N and P devices wherein the gate insulator is formed initially and then no appreciable thermal process steps are provided until at the end of the process when a single oxidation provides isolation and source-drain passivation concurrently after the P or N well, P channel and N channel source/drain regions, and field threshold adjust implant are in place. Also, the field dopant for the N channel device is introduced after the gate insulation, source/drain diffusions and the P well are substantially fabricated.

In a more specific aspect of this invention, a process is provided for making a complementary metal oxide semiconductor (CMOS) bulk structure which includes forming an oxidation barrier layer on a semiconductor substrate of a given conductivity type having first and second portions. A well is formed in the first portion of the substrate having a conductivity of opposite type to that of the given conductivity type. Source and drain regions are then defined in the well and a first channel region therebetween. A first portion of the oxidation barrier layer over the source and drain regions is removed and a first impurity of the given conductivity type is implanted into the source and drain regions. At this point in the process, if desired, when the source and drain regions are formed for an N channel device, a thermal step may be employed to essentially form the final diffusion profile. A field region in the well is defined and a second portion of the oxidation barrier layer over the field region is removed. The process then includes implanting a second impurity of the opposite conductivity type into the field region, defining source and drain regions in the second portion of the substrate and a second channel region therebetween, removing a third portion of the oxidation barrier layer over the second portion source and drain regions and implanting a third impurity of the opposite conductivity type into the second portion source and drain regions. An isolation region is defined in the substrate outside of the first and second channel regions and a fourth portion of the oxidation barrier layer over the isolation region is removed. The entire surface of the substrate outside of the first and second channel regions is then oxidized.

The foregoing and other objects, features and advantages of the invention will be apparent from the following and more particular description of the preferred embodiments of the invention, as illustrated in the accompanying drawings.

BEST MODE FOR CARRYING OUT THE INVENTION

Figure 1:
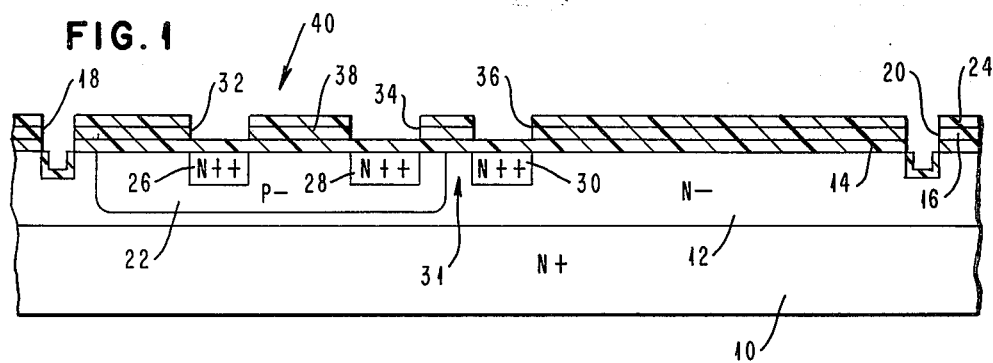
FIGS. 1–6 are sectional views of the CMOS structure made after successive steps during the process of the present invention.

Referring to the drawings in more detail, there is illustrated in FIG. 1 a sectional view of the CMOS structure made in accordance with the process of the present invention during an early stage of the fabrication thereof. The structure includes a semiconductor substrate 10, which is of an N+ conductivity type silicon and an epitaxial semiconductor layer 12, preferably N− type silicon, grown on substrate 10. A thin layer of silicon dioxide 14 is grown on the epitaxial layer 12 and a layer of silicon nitride 16 is deposited, preferably by known low pressure chemical vapor deposition techniques, on the silicon dioxide layer 14. The thickness of the epitaxial silicon layer 12 may be from 1 to 15 micrometers and have a resistivity range from 5 to 50 ohm-centimeters, and each of the layers 14 and 16 may be 15 nanometers thick.

With a first conventional photoresist mask, not shown, openings 18 and 20 are formed in the epitaxial layer 12 to provide alignment marks by etching the silicon nitride and silicon dioxide layers 16 and 14, respectively, in carbon tetrafluoride ($CF_4$) and oxygen gas followed by carbon tetrafluoride and hydrogen gas and by etching about 0.3 micrometers of the epitaxial layer 12 in carbon tetrafluoride and oxygen. The photoresist mask is then stripped in an oxygen plasma and the surface of the remaining structure cleaned by any known process.

A second photoresist mask, not shown, is provided over the silicon nitride layer 16 to define a P− well 22, wherein boron ions are implanted and driven in partially by a known heat process after the photoresist mask is removed. A layer of oxynitride 24 is grown on the silicon nitride layer 16 and an oxide is grown in openings 18 and 20 during this thermal step. A third mask, not shown, is provided to define N++ source and drain regions 26 and 28 in P− well 22 and an N++ contact region 30 in N− epitaxial layer 12 aligned with openings 32, 34 and 36, respectively, in oxynitride layer 24 and silicon nitride layer 16. The N++ region 30 spaced from P− well 22 by region 31 may be used to serve as a guardring to limit latch-up. Openings 32 and 34 define the gate dielectric medium 38 for an N channel device 40. N++ source and drain regions 26 and 28, respectively, and contact region 30 are then formed by known arsenic ion implantation techniques at an energy of, preferably, 50 KeV with a dose of $4 \times 10^{15}$ per square centimeter. If desired, the N++ diffusions may be driven in to virtually their final depth by an inert annealing step. This permits minimal subsequent heat treatments that provide for minimal field encroachment into the active N device channel region and allows minimum depth P channel sources and drains.

Figure 2:
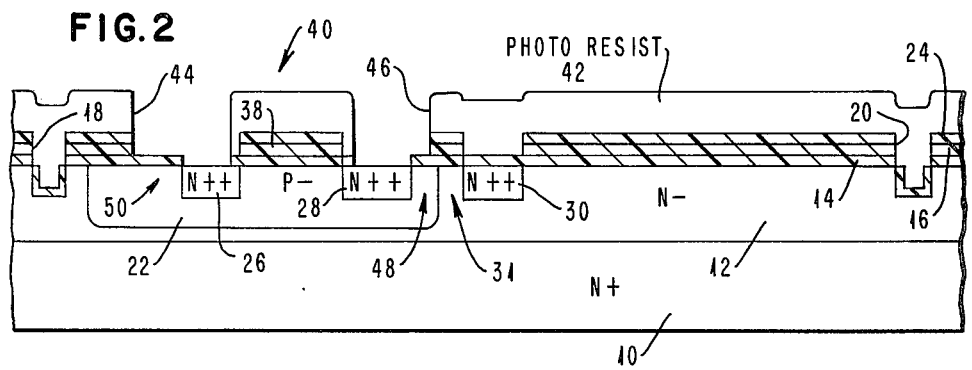
Figure 3:
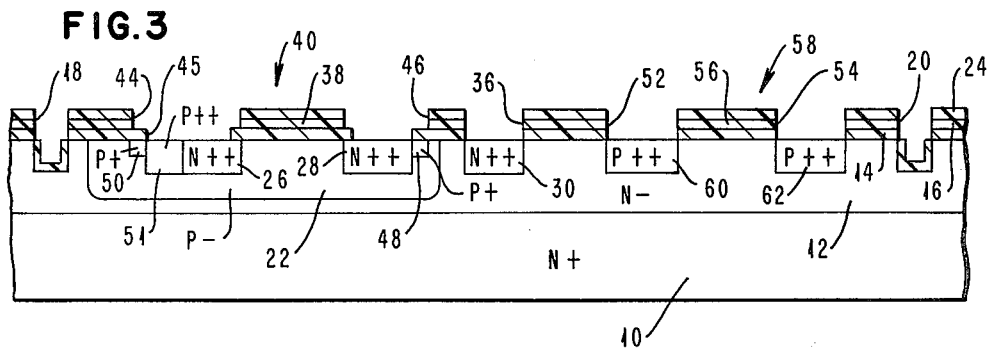
Figure 4:
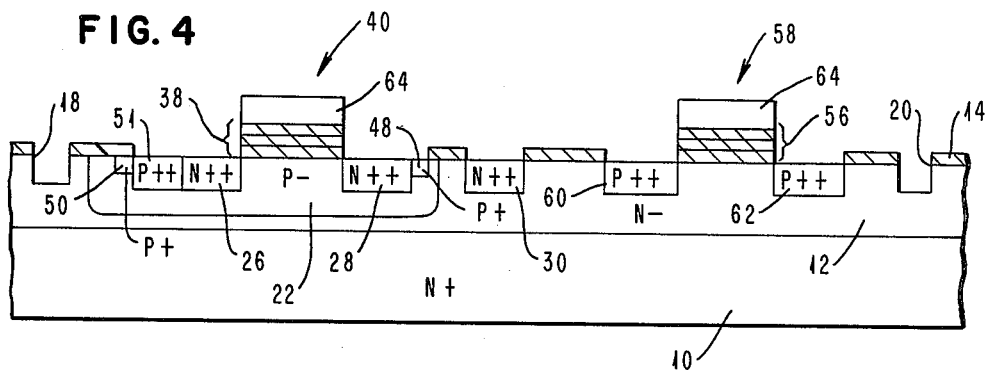
Figure 5:
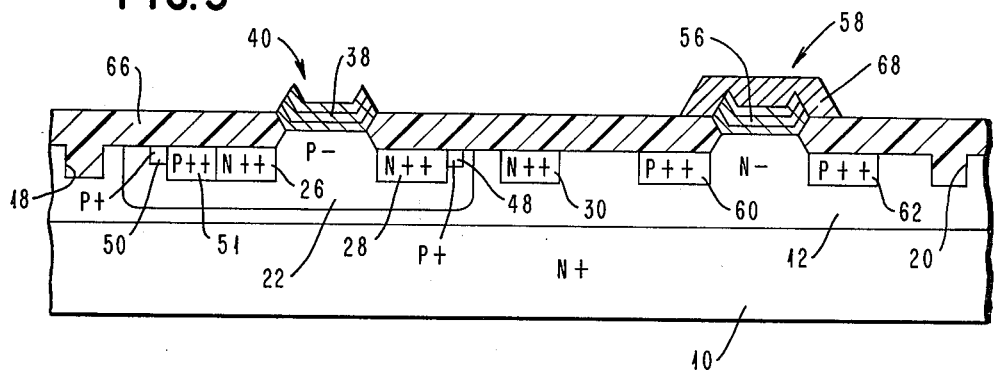
Figure 6:
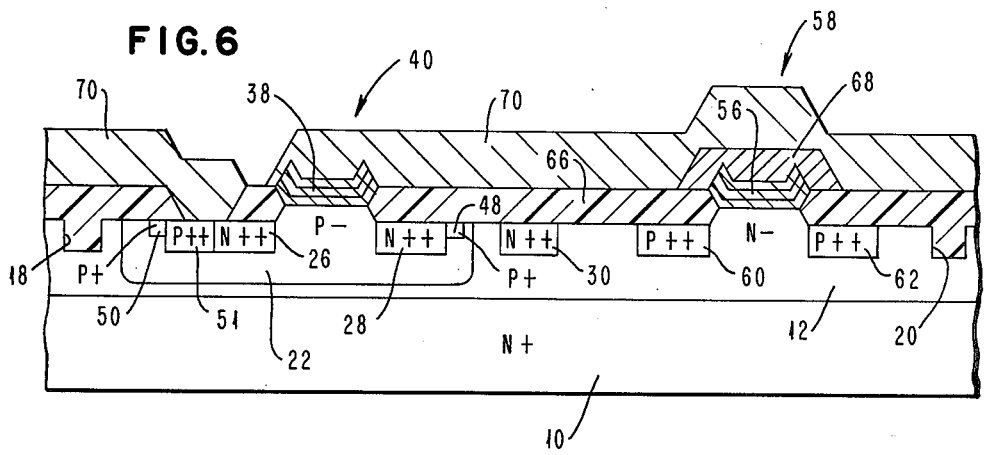

As indicated in FIG. 2 of the drawings, a fourth photoresist mask 42 having openings 44 and 46 therein is provided over the oxynitride layer 24 to define P+ field regions 48 and 50, shown more clearly in FIG. 3 of the drawings. The regions 48 and 50 are lightly doped, e.g., $10^{12}$ ions per square centimeter, with preferably boron ions after the oxynitride layer 24 and silicon nitride layer 16 are appropriately removed from the openings 44 and 46. It should be noted that the N channel field regions 48 and 50 are, preferably, fully contained within the P well. A fifth mask, not shown, defines openings 52 and 54, and thus gate dielectric medium 56 for a P channel device 58, and also P++ source and drain regions 60 and 62, indicated in FIG. 3 of the drawings. The fifth mask is also provided with an opening 45 over a portion of the field region 50 to form a P well contact region 51. Thus, P++ source, drain and P well contact ion implants with, preferably, boron, are introduced into the epitaxial layer 12 through the openings 45, 52 and 54, at an energy of, preferably, 10–50 KeV with a dose of $2-5 \times 10^{15}$ per square centimeter or $BF_2$ at 5–25 KeV and $2-5 \times 10^{15}$ per square centimeter. A sixth photoresist mask 64, shown in FIG. 4, provides for the final definition of a field isolation and source and drain regions passivation layer 66 illustrated in FIG. 5. The exposed oxynitride layer 24 and the silicon nitride layer 16, i.e., all of layers 24 and 16 except in gate dielectric media 38 and 56, are etched away, as indicated in FIG. 4 and then the photoresist mask 64 is removed by known techniques.

The structure illustrated in FIG. 4 with photoresist mask 64 removed is now heated to 800°–1000° C. and maintained at this temperature for approximately one hour in 2–4% hydrogen chloride gas and steam to convert the entire surface of the epitaxial layer 12, except for the portions under the gate dielectric media 38 and 56, into silicon dioxide, forming a relatively thick insulating layer 66 serving as field isolation and source-drain region passivation. Alternatively, high pressure oxidation could be used, or very low temperature plasma enhanced oxidation, as is known. The latter permits extremely low temperature processing which is desirable for extremely high density device structures. During the formation of the thick insulating layer 66, the boron and arsenic are driven further into the epitaxial layer 12 or activated to form substantially the final P and N type diffusion regions shown in FIG. 5.

By using known liftoff techniques, a seventh photoresist mask, not shown, is provided having an opening aligned with the gate dielectric medium 56 of the P channel device 58. Using ion implantation techniques, the channel region of the device 58 is threshold adjusted through the opening in the seventh mask and a work function-adjusted electrode material, such as platinum silicide, is evaporated over the gate dielectric medium 56 to form the P channel gate electrode 68. It should be noted that, if desired, the oxynitride layer 24 in medium 56 may be removed before forming electrode 68. Furthermore, if desired, the remaining portions of the silicon diode layer 14 and silicon nitride layer 16 may also be removed and a new gate dielectric structure formed.

After removing the seventh photoresist mask, the channel region threshold of the N channel device 40 is adjusted by ion implantation using the gate electrode 68 as a mask for the implanted ions, followed by a short activation anneal. By again using a liftoff technique, a gate electrode 70, or land pattern, preferably made of aluminum, may be formed over the gate dielectric medium 38 for the N channel device 40.

It can be seen that the method in accordance with the teachings of this invention is very simple, requiring only seven masking steps and provides a very dense bulk CMOS structure. The channel lengths of the P channel and N channel transistors are tightly controlled to provide short channels resulting in higher speeds. Since the process provides thick oxides over the sources and drains of the P channel and N channel transistors, the structure has a low gate electrode overlap capacitance. Also, the process provides separate field region controls inside the P well 22 without severe compensation at the edge thereof which permits closer spacing between N++ region 28 and P++ region 60 without encountering a latch-up problem.

It should be noted that the process of this invention provides a unique bulk CMOS structure, i.e., without the need of a dielectric substrate, which has improved planarity. Furthermore, the process of this invention provides an improved method for obtaining isolation and source/drain passivation simultaneously, i.e., during one process step, with minimal dopant diffusions. It can be seen that in this bulk CMOS process all P or N well, P channel and N channel source/drain regions, gate insulators and field threshold adjust implants are in place before the surface of the epitaxial layer 12 is oxidized for isolation and passivation purposes. Also, the process provides independent N and P region doping in the field region and separate threshold adjustment implants, in view of the predetermined doping levels established during the growth of the N− epitaxial layer 12.

It should be understood that, if desired, the epitaxial layer 12 need not be provided in the practice of this invention and that an N− well may be formed in a P substrate or a P or P+ epitaxial layer. Also, dual wells may be provided, i.e., independently doped N and P wells in an intrinsic epitaxial layer. Although platinum silicide and aluminum have been suggested hereinabove for use in making the structure, various other known materials, such as P+ polysilicon and well known polycides, may likewise be used.

The process and structure of this invention may be conveniently used to make logic circuitry, e.g., a 3-way NOR circuit, or an array of random access memory cells, e.g., static cells.

While the invention has been particularly shown and described with reference to preferred embodiments thereof, it will be understood that those skilled in the art that various changes in form and details may be made therein without departing from the spirit and scope of the invention.

What is claimed is:

1. A process for making a complementary metal oxide semiconductor (CMOS) structure comprising the steps of:

forming a well having a P type conductivity in a semiconductor substrate having an N type conductivity, forming first and second N type conductivity regions defining a channel region within said well, forming within said well a P type region having a more positive conductivity than that of said well surrounding said first and second N type conductivity regions and said channel region and having a contact region within said P type conductivity region butted with respect to one of said first and second N type conductivity regions, forming a P channel device having a control electrode and source and drain regions in said semiconductor substrate without said P type well, said source and drain regions being formed simultaneously with said contact region, forming a control electrode over said channel region having a different work function from that of the work function of the control electrode of said P channel device and forming a single electrode in contact with said contact region and said one N type conductivity region.

2. A process for making a complementary metal oxide semiconductor (CMOS) structure as set forth in claim 1 wherein said P type conductivity region is spaced from the edge of said P type well.

3. A process for making a complementary metal oxide semiconductor (CMOS) structure as set forth in claim 1 further including annealing said first and second N type conductivity regions before forming said P type conductivity region.

4. A process for making a complementary metal oxide semiconductor (CMOS) structure as set forth in claim 1 further including the step of simultaneously forming an N type conductivity guardring region in said semiconductor substrate without said P type well with said first and second N type conductivity regions.

5. A process for making a complementary metal oxide semiconductor (CMOS) structure as set forth in claim 4 wherein said guardring region is formed prior to the formation of said P type conductivity region.

6. A process for making a complementary metal oxide semiconductor (CMOS) structure comprising the steps of:

forming an N− type epitaxial layer on an N+ type silicon substrate, forming a well having a P− type conductivity in said epitaxial layer, introducing an N type impurity into said well for forming first and second N+ type conductivity regions defining a channel region within said well, annealing said epitaxial layer to drive in said N type impurity for forming substantially the final profile of said first and second N+ regions, forming a P+ type conductivity region within said P− type well abutting said first and second N+ type conductivity regions and surrounding said channel region, forming a P channel device having a first control electrode in said epitaxial layer without said P− type well, forming a contact on said P+ type conductivity region, and forming a second control electrode over said channel region, said second electrode having a different work function from that of the first control electrode of said P channel device and said contact on said P+ type conductivity region also contacting one of said first and second N+ type conductivity regions.

7. A process for making a complementary metal oxide semiconductor (CMOS) structure as set forth in claim 6 wherein said P+ type conductivity region is spaced from the edge of said P− type well.

8. A process for making a complementary metal oxide semiconductor (CMOS) structure as set forth in claim 6 further including the step of simultaneously forming an N+ type conductivity guardring region in said N− type epitaxial layer without said P− type well with said first and second N+ type conductivity regions.

9. A process for making a complementary metal oxide semiconductor (CMOS) structure comprising the steps of:

forming an oxidation barrier layer on a semiconductor substrate of a given conductivity type having first and second portions, forming a well in the first portion of said substrate having a conductivity type opposite to that of said given conductivity type, defining source and drain regions in said well, removing a first portion of said oxidation barrier layer over said source and drain regions, implanting a first impurity of said given conductivity type into said source and drain regions, defining a field region in said well, removing a second portion of said oxidation barrier layer over said field region, implanting a second impurity of said opposite conductivity type into said field region, defining source and drain regions in the second portion of said substrate, removing a third portion of said oxidation barrier layer over said second portion source and drain regions, implanting a third impurity of said opposite conductivity type into said second portion source and drain regions, defining an isolation region in said substrate, removing a fourth portion of said oxidation barrier layer over said isolation region, and oxidizing the surface of said substrate without the remaining portion of said oxidation barrier layer.

10. A process for making a complementary metal oxide semiconductor (CMOS) structure as set forth in claim 9 wherein said given conductivity type is N conductivity type and said opposite conductivity type is P conductivity type.

11. A process for making a complementary metal oxide semiconductor (CMOS) structure as set forth in claim 9 wherein said source and drain regions are defined by openings in a first photoresist mask and said first impurity is arsenic.

12. A process for making a complementary metal oxide semiconductor (CMOS) structure as set forth in claim 11 wherein said field region is defined by openings in a second photoresist mask and said second impurity is boron.

13. A process for making a complementary metal oxide semiconductor (CMOS) structure as set forth in claim 12 wherein said third impurity is boron and further including the steps of forming a first control electrode having a given work function between said source and drain regions of said first portion and forming a second control electrode having a work function different from said given work function between said source and drain regions of said second portion.

14. A process for making a complementary metal oxide semiconductor (CMOS) structure as set forth in claim 13 further including the step of forming a single ohmic contact to said field region and to one of said source and drain regions of said first portion.

15. A process for making a complementary metal oxide semiconductor (CMOS) structure comprising the steps of:

forming an oxidation barrier layer on a semiconductor substrate of a given conductivity, forming a well having a conductivity opposite to that of said given conductivity in said semiconductor substrate, forming within said well through a first opening in said oxidation barrier layer first and second regions having said given conductivity defining a channel region, forming within said well through a second opening in said oxidation barrier layer a region of opposite conductivity having a higher conductivity than that of said well surrounding said first and second regions and said channel region, forming through a third opening in said oxidation barrier layer source and drain regions in said semiconductor substrate without said well, and oxidizing the surface of said substrate through a fourth opening in said oxidation barrier layer.

* * * * *